(12) United States Patent
Gooch

(10) Patent No.: US 7,514,684 B2
(45) Date of Patent: Apr. 7, 2009

(54) SURFACE MOUNTED INFRARED IMAGE DETECTOR SYSTEMS AND ASSOCIATED METHODS

(75) Inventor: Roland W. Gooch, Dallas, TX (US)

(73) Assignee: L-3 Communications Corporation, New York, NY (US)

(*) Notice: Subject to any disclaimer, the term of this patent is extended or adjusted under 35 U.S.C. 154(b) by 153 days.

(21) Appl. No.: 11/511,199

(22) Filed: Aug. 28, 2006

(65) Prior Publication Data

US 2008/0048120 A1 Feb. 28, 2008

(51) Int. Cl.
G01J 5/04 (2006.01)
(52) U.S. Cl. .................................. 250/338.4
(58) Field of Classification Search ............... 250/239, 250/341.8, E21.505, 338.4
See application file for complete search history.

(56) References Cited

U.S. PATENT DOCUMENTS

| 5,561,295 | A * | 10/1996 | Jacksen et al. ............ 250/338.4 |
| 5,821,532 | A * | 10/1998 | Beaman et al. ............. 250/239 |
| 6,251,706 | B1 * | 6/2001 | Paniccia ..................... 438/122 |
| 6,392,232 | B1 | 5/2002 | Gooch ........................ 250/332 |
| 6,479,320 | B1 | 11/2002 | Gooch ........................ 438/109 |
| 6,521,477 | B1 | 2/2003 | Gooch ........................ 438/106 |
| 6,586,831 | B2 | 7/2003 | Gooch ........................ 257/704 |
| 6,690,014 | B1 | 2/2004 | Gooch et al. ............. 250/338.4 |
| 6,777,681 | B1 | 8/2004 | Schimert et al. ......... 250/338.4 |
| 6,943,424 | B1 * | 9/2005 | Kim ........................... 257/433 |
| 2002/0003960 | A1 * | 1/2002 | Melman et al. ............. 396/429 |
| 2002/0079572 | A1 * | 6/2002 | Khan et al. ................. 257/707 |
| 2003/0194832 | A1 * | 10/2003 | Lopata et al. ............... 438/108 |
| 2004/0166763 | A1 * | 8/2004 | Hanada et al. ................ 445/51 |
| 2005/0073017 | A1 * | 4/2005 | Kim ........................... 257/433 |
| 2007/0108545 | A1 * | 5/2007 | Chua et al. .................. 257/433 |
| 2007/0272827 | A1 * | 11/2007 | Heo et al. ................. 250/208.1 |

* cited by examiner

Primary Examiner—David P Porta
Assistant Examiner—Mark R Gaworecki
(74) Attorney, Agent, or Firm—O'Keefe, Egan, Peterman & Enders, LLP

(57) ABSTRACT

An infrared image detector system mounted on a printed circuit board (PCB) is disclosed for use with an infrared imaging system such as an infrared camera. A semiconductor die having an infrared detector array and connection points on a first surface is mounted to a PCB and electrically coupled to electrical connection points on a PCB. In addition, a heat sink can be coupled to an opposing second surface of the semiconductor die. Still further, the PCB can have a window within which the infrared image detector array can be positioned so that the infrared image detector system can be mounted to one side of the PCB while infrared radiation incident on the second side of the PCB will reach the infrared image detector array through the window.

19 Claims, 6 Drawing Sheets

SURFACE MOUNTED INFRARED IMAGE DETECTOR SYSTEMS AND ASSOCIATED METHODS

TECHNICAL FIELD OF THE INVENTION

This invention relates to infrared image detector systems and, more particularly, to infrared image detector systems utilized for infrared cameras or other infrared devices.

BACKGROUND

Technology has existed to connect integrated circuits to printed circuit boards (PCBs). Known previously are various forms of surface mount technology, such as "chip on board" technology, wherein a semiconductor die is glued to a printed circuit board (PCB), wire bonded, and covered with a drop of epoxy. Another known surface mount technique is a "flip chip" technology, wherein a semiconductor die is inverted and connected by various forms of extensions of its bond pads directly to electrical connection points or pads on the PCB. In some systems, ceramic packages have lead frames which are soldered to the PCB. Other forms of current surface mount technology include inverting a semiconductor die onto the PCB and using solder pads distributed over the upper device or surface of the semiconductor die, protected by a polyimide layer, for both attachments and electrical connections.

Infrared image detector systems have been utilized previously for infrared cameras and other infrared devices. Many infrared image detectors require a vacuum package that makes the use of surface mount technology impractical. Thus, surface mount technology has traditionally been considered incompatible with and has not been used for vacuum-sealed infrared image detector arrays.

One example of a vacuum-sealed infrared image detector is a wafer-level vacuum-packaged infrared detector available from the Commercial Infrared division of L3 Communications. These infrared detectors are mechanically mounted to a heat sink and then electrically connected to processing circuitry on a PCB by a flat flexible multi-conductor lead, or ribbon connector, attached to semiconductor die bonding pads with anisotropic conductive film (ACF) on one end and a pin connector on the other. These thin ribbon connector conductors, however, are vulnerable to damage incurred by excessive flexing, and can be cumbersome. Examples for wafer-level vacuum-packaged infrared detectors are described, for example, in U.S. Pat. No. 6,392,232; U.S. Pat. No. 6,479,320; U.S. Pat. No. 6,521,477, U.S. Pat. No. 6,586,831; U.S. Pat. No. 6,690,014; and U.S. Pat. No. 6,777,681; each of which is hereby incorporated by reference in its entirety.

SUMMARY OF THE INVENTION

An infrared image detector system and associated methods are disclosed for mounting infrared image detector arrays on printed circuit boards (PCBs) for use with infrared imaging systems such as an infrared camera. A semiconductor die having an infrared detector array and connection points on a first surface is mounted to a PCB and electrically coupled to electrical connection points on a PCB. In addition, a heat sink can be coupled to an opposing second surface of the semiconductor die. Still further, the PCB can have a window within which the infrared image detector array can be positioned so that the infrared image detector system can be mounted to one side of the PCB while infrared radiation incident on the second side of the PCB will reach the infrared image detector array through the window. Mounting an infrared image detector system to a PCB provides a more reliable system that is less costly to manufacture and maintain. As described herein, various different embodiments and configurations may be implemented, as desired.

DESCRIPTION OF THE DRAWINGS

It is noted that the appended drawings illustrate only exemplary embodiments of the invention and are, therefore, not to be considered limiting of its scope, for the invention may admit to other equally effective embodiments.

DETAILED DESCRIPTION OF THE INVENTION

Systems and methods are disclosed for mounting an infrared image detector system on a printed circuit board (PCB), particularly for use with infrared cameras or other infrared devices in which surface mount technology has not been implemented previously. As described in more detail below with respect to the drawings, a semiconductor die having an infrared detector array and connection points on a first surface can be mounted to a PCB and electrically coupled to electrical connection points on a PCB. In addition, a heat sink can be coupled to an opposing second surface of the semiconductor die. Still further, the PCB can have window within which the infrared image detector array can be positioned so that the infrared image detector system can be mounted to one side of the PCB while infrared radiation incident on the second side of the PCB will reach the infrared image detector array through the window. Various example embodiments and configurations are now discussed with respect to the drawings.

Figure 1:
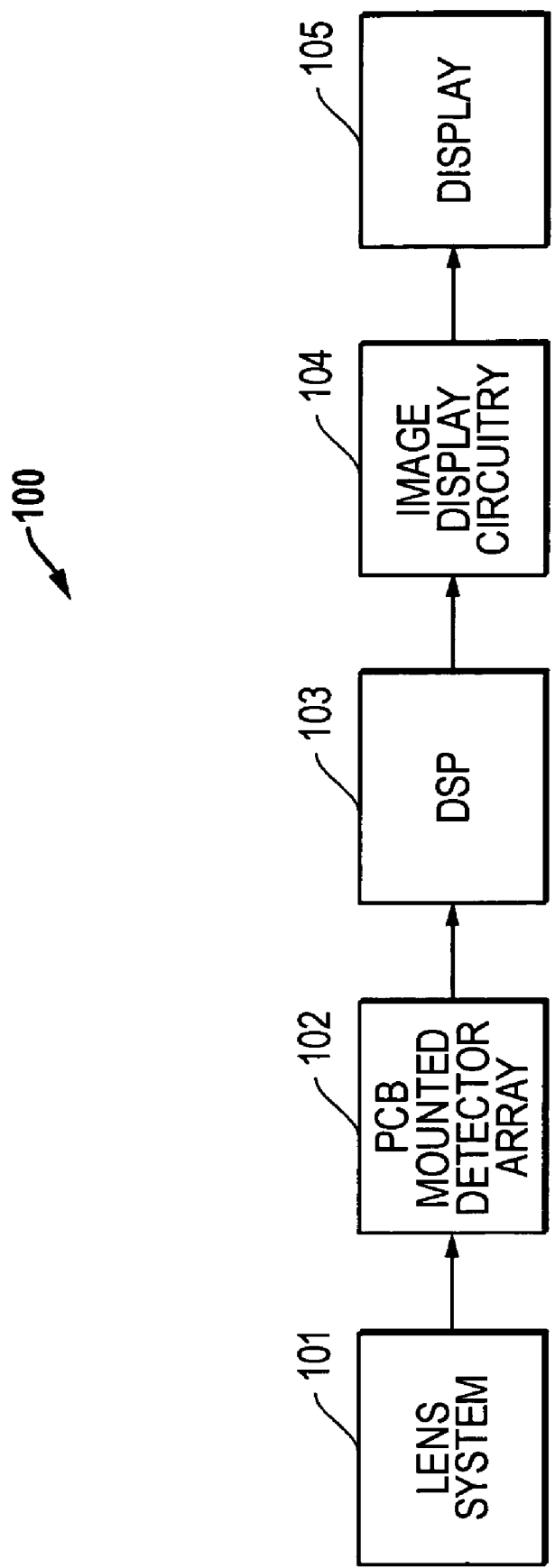
FIG. 1 is a block diagram of an infrared camera system.

FIG. 1 shows a general diagram of an infrared camera system 100. Infrared energy or radiation has a longer wavelength than visible light and is invisible to the human eye. Thermal imagers sense infrared energy from objects within a scene, and this infrared energy varies with an object's temperature. In the embodiment depicted, the infrared camera system 100 includes an infrared lens system 101 through which energy from a scene is received and focused on to an infrared image detector array 102. Once detected by the infrared image detector array 102, the infrared energy information is digitized and then passed on to digital signal processor (DSP) 103 for image processing. The image display circuitry 104 translates the processed infrared data into an image that can be displayed on a display 105 such as a color LCD screen on the infrared image detector system.

As discussed further in the various embodiments described below, this infrared image detector array 102 can be mounted to a surface such as a printed circuit board (PCB). As discussed above, rather than mount the infrared image detector array to a PCB, current infrared camera systems utilize ribbon connectors or flat, flexible multi-conductor leads to connect a infrared image detector system to other circuit components. The embodiments below disclose techniques and structures for avoiding the use of such a ribbon connector.

Figure 2:
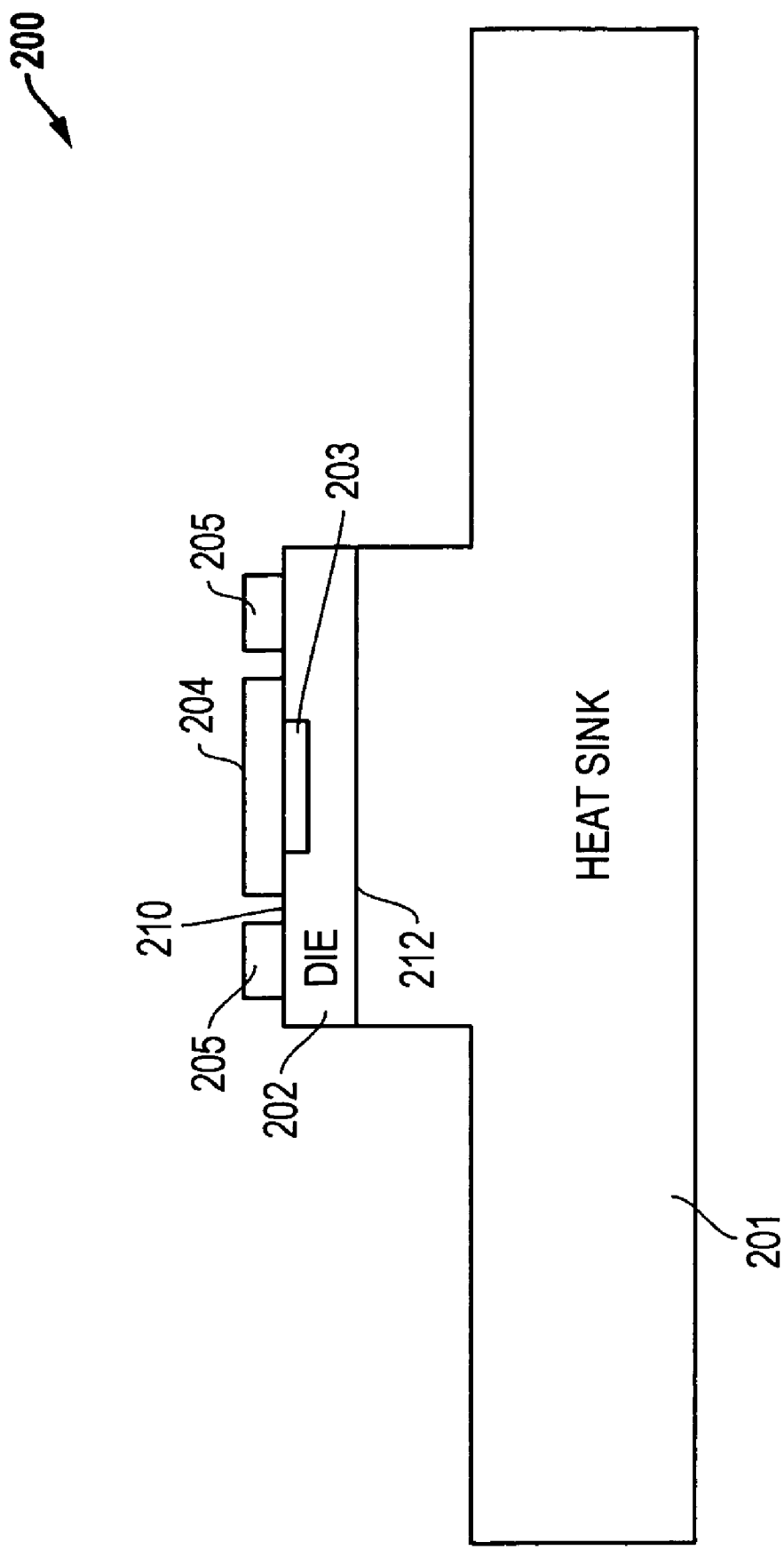
FIG. 2 is an example diagram of an infrared detector system including a heat sink.

FIG. 2 shows an example embodiment for an infrared detector system 200 including a heat sink 201. A semiconductor die 202 has a first and a second opposing surfaces 210 and 212. An infrared image detector array 203 is formed on the first surface 210 of the semiconductor die 202. It is noted that element 203 can include a region above the detector array within which a vacuum can be formed as discussed below with respect to wafer-level vacuum-packaged infrared detector systems. The semiconductor die 202 has a lid 204 attached to the first surface 210 to cover the infrared detector array 203. The lid 204 is configured to be transparent to infrared radiation thereby allowing infrared scene energy to reach the image detector array 203. A plurality of connection points 205 on the first surface 210 of the semiconductor die 202 are electrically coupled to the circuitry formed with the semiconductor dies 202 including the image detector array 203. As described below, the connection points 205 can be utilized to electrically couple the infrared detector system 200 to a printed circuit board (PCB). A heat sink 201 can also be provided and is coupled to the second surface 212 of the semiconductor die 202. It is noted that the connection points 205 can be, for example, bond pad sites formed on the semiconductor die 202 and can include solder balls placed on these bond pads for purposes of direct surface mounting according to standard processes for surface mount technology. It is noted that the surface mounting discussed herein with respect to infrared detectors contemplates having bond pads on top of the detector semiconductor die 202, where traditional surface mount technology often refers to soldering leadless components onto a board using the solder contacting pads on the sides of the integrated circuit.

As indicated above, the infrared detector system 200 can be formed using wafer-level vacuum-packaging as described, for example, in U.S. Pat. No. 6,392,232; U.S. Pat. No. 6,479,320; U.S. Pat. No. 6,521,477, U.S. Pat. No. 6,586,831; U.S. Pat. No. 6,690,014; and U.S. Pat. No. 6,777,681; each of which is hereby incorporated by reference in its entirety. As described therein, wafer-level vacuum-packaging techniques are utilized to form amorphous silicon (aSi) infrared bolometer imagers where a bonding method is used to connect the lid 204 to the semiconductor die 202 thereby forming a vacuum region above the detector array which together can be represented by the element 203 as discussed above.

The PCB 301 can be any desired material that is used to mount electronic components and/or integrated circuits and to route electrical connections among them. For example, PCB 301 can be a rigid, flat board made of a insulating material onto which routing circuitry can be etched or formed in order to provide interconnectivity among mounted components and other circuits or components. PCBs are often made with multiple layers, typically two to ten, that interconnect components via copper pathways.

Figure 3:
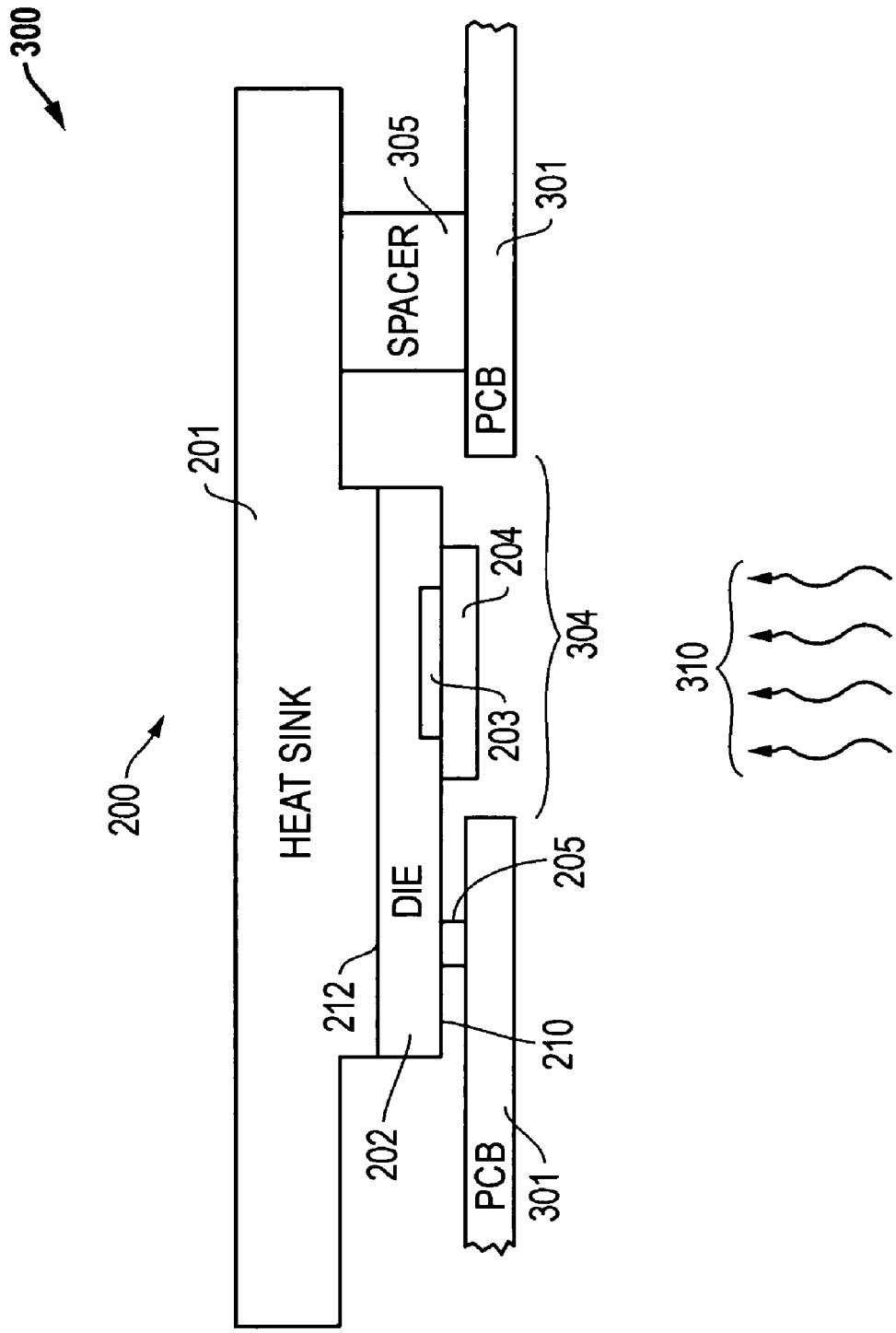
FIG. 3 is a diagram of an infrared detector system mounted to a printed circuit board (PCB) through a window in the PCB using surface mount technology for connections.

FIG. 3 shows an example embodiment 300 of an infrared detector system 200 mounted to a printed circuit board (PCB) 301 through a window 304 in the PCB 301 using surface mount technology. As depicted in FIG. 2, a heat sink 201 is coupled to back opposing surface 212 of the semiconductor 202. The infrared detector array 203 is formed on the front surface 210 of the semiconductor die 202. The lid 204 covers the infrared detector array 203. Connection points 205 are provided for electrically coupling the semiconductor die 202 to the PCB 301. In addition, a spacer 305 is included for further structural and mechanical support and can be used to connect the heat sink 201 to the PCB 301. It is noted that one or more spacers 305 can be utilized and the placement of these spacers can be configured as desired. The material used for the spacers 305 is preferably a non-conductive, insulating material that will provide a good mechanical connection between the heat sink 201 and the PCB 301. It is also noted that although the connection points 205 are depicted on one side of the semiconductor die 202, the connection points 205 could be provided on one or more sides of the semiconductor die 202, as desired. In addition, electrical connections could be made by interposing a z-axis connector between bond pads on the semiconductor die 202 and connection points on the PCB 301, and the z-axis connector can be an elastomeric strip with metallic conductor stripes on the surface. Other variations could be implemented as desired.

The window 304 within the PCB 301 is understood to be any desired shape; however, it will likely be selected according to the shape of the infrared detector array 203. The primary purpose of the window 304 is to allow infrared energy 310 received through the lens system 101 to reach the infrared detector array 203. Thus, the infrared detector system 200 has in effect been mounted on the back of the PCB 301 if the infrared energy 310 is considered to be directed to and incident on the front of the embodiment 300. The window, therefore, allows the energy to pass through the PCB 301. It is assumed, therefore, for the purposes of this embodiment 300, that the PCB 301 or other mounting board will be made from a material or include materials that are not transparent to infrared radiation. It is noted, however, that a material transparent to infrared radiation could also be placed over or across the window 304, if desired, while still allowing infrared energy to reach the infrared detector array 203.

Figure 4:
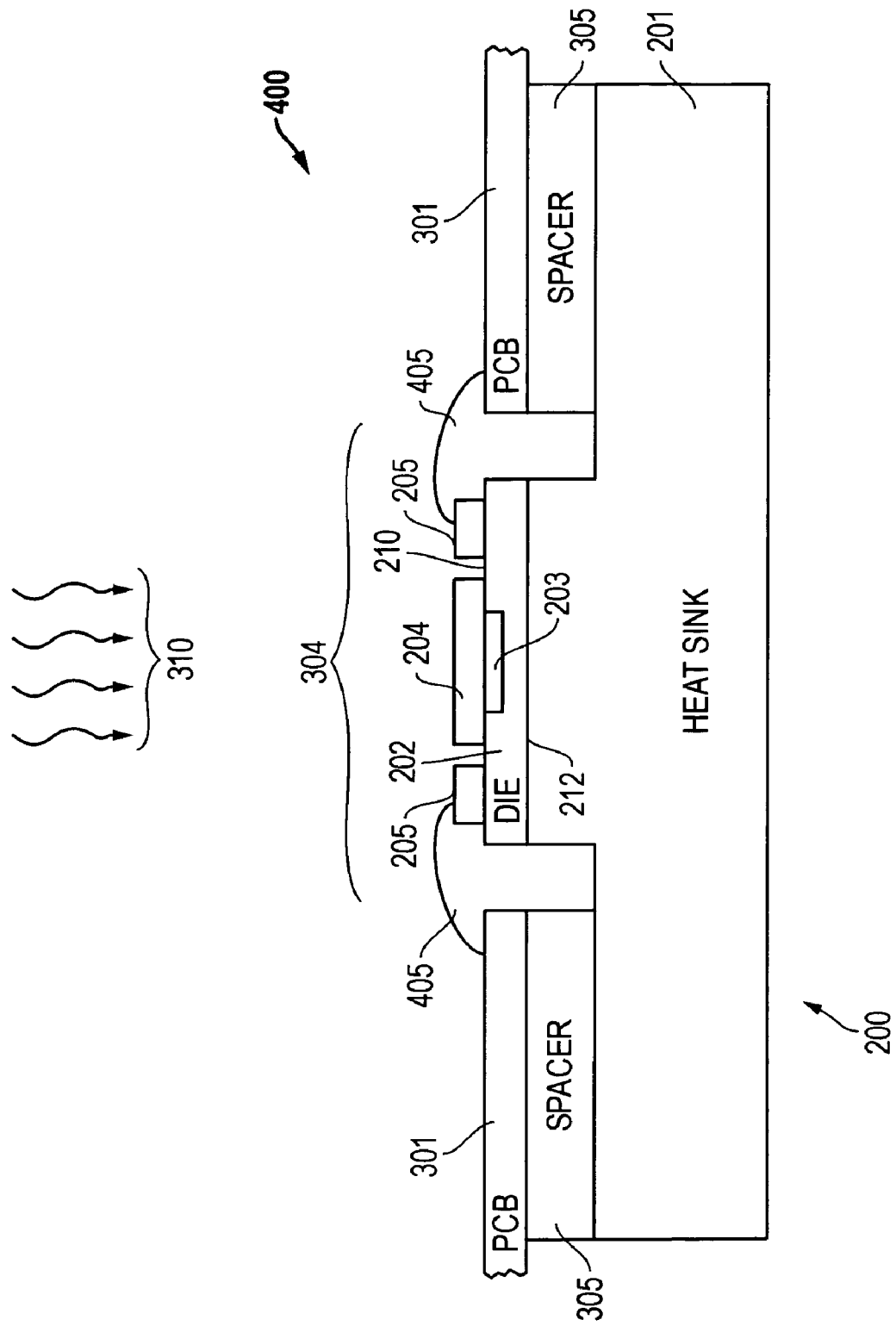
FIG. 4 is a diagram of an embodiment for an infrared detector system mounted to a printed circuit board (PCB) through a window in the PCB using spacers and using leads to make electrical connection.

FIG. 4 shows an alternative example embodiment 400 of an infrared detector system 200 mounted to a printed circuit board (PCB) using spacers 305 and using flexible leads 405 and/or lead frames to provide electrical connection between the semiconductor die 202 and the PCB 301. In FIG. 4, the plurality of connection points 205 on the semiconductor die 202 are connected with lead wires 405 to connection points on the PCB 301. It is noted that in this embodiment as depicted, connection points 205 are located on two sides of the semiconductor die 202, but could be located on one or more sides, as desired. Spacers 305 are configured to couple the PCB 301 to the heat sink 201 as described above. As with FIG. 3, a heat sink 201 is coupled to back opposing surface 212 of the semiconductor 202. The infrared detector array 203 is formed in the front surface 210 of the semiconductor die 202. The lid 204 is again covering the infrared detector array 203. Unlike FIG. 3, however, traditional surface mount techniques are not used to provide the electrical and mechanical connections. Rather, the infrared detector system 200 is coupled to the PCB 301 and is structurally supported by the spacers 305. Other variations could be implemented as desired.

Figure 5:
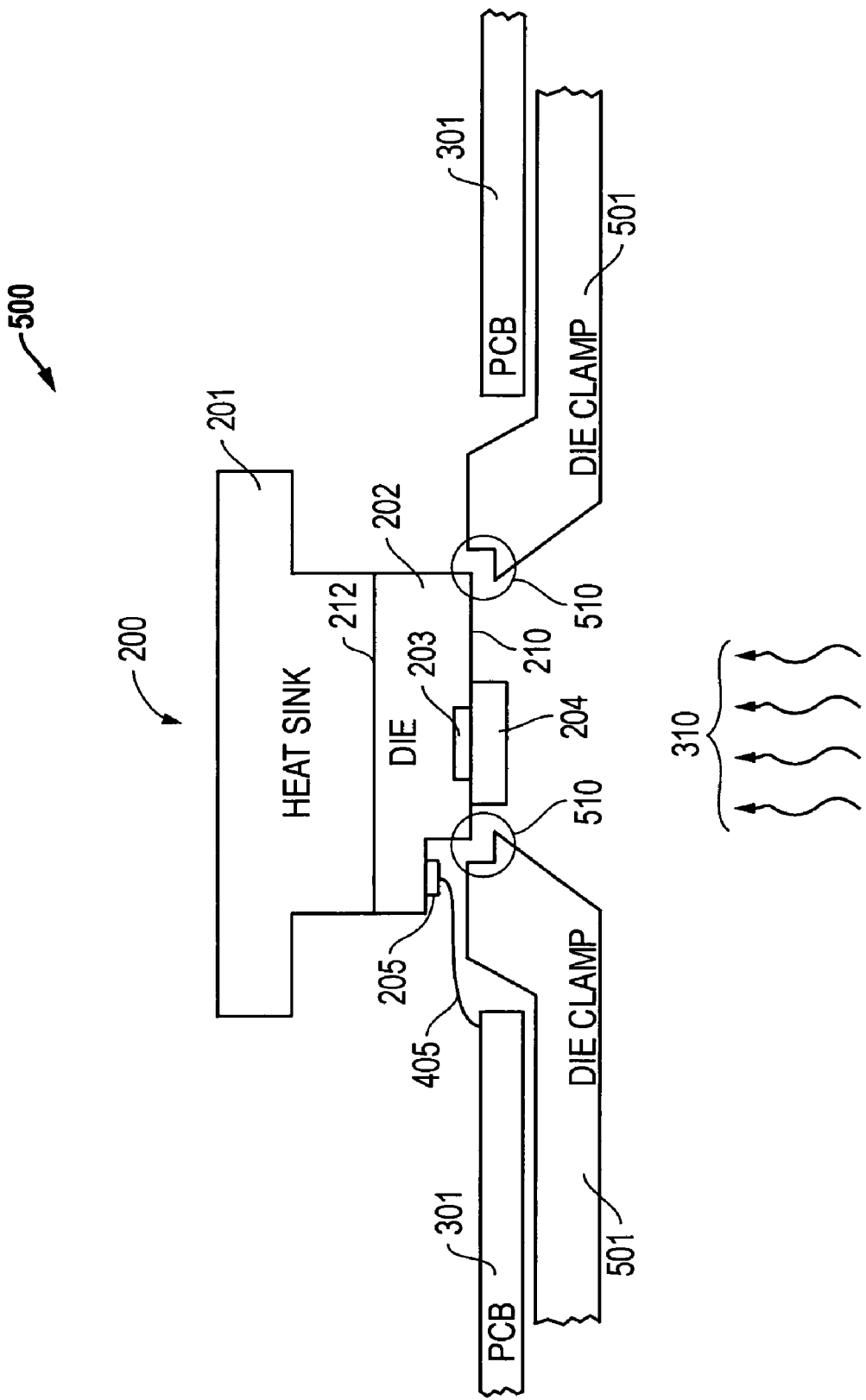
FIG. 5 is a diagram of an infrared detector system mounted to a printed circuit board (PCB) using a die clamp coupled to the PCB and using a lead frame or flex lead to make electrical connections between the semiconductor die and the PCB.

FIG. 5 shows a further alternate embodiment 500 of an infrared detector system 200 mounted to a printed circuit board (PCB) 301 using a die clamp 501 and using flexible leads 405 and/or lead frames to provide electrical connection between the semiconductor die 202 and the PCB 301. In FIG. 5, the plurality of connection points 205 on the semiconductor die 202 are connected with lead wires 405 to connection points on the PCB 301. It is noted that in this embodiment as depicted, connection points 205 are located on one side of the semiconductor die 202, but could be located on two or more sides, as desired. As with FIGS. 3 and 4, a heat sink 201 is coupled to back opposing surface 212 of the semiconductor 202. The infrared detector array 203 is formed on the front surface 210 of the semiconductor die 202. The lid 204 is again covering the infrared detector array 203. Unlike FIGS. 3 and 4, however, traditional surface mount techniques and spacers 305 are not used to provide the electrical and mechanical connections. Rather, the infrared detector system 200 is coupled to the PCB 301 using die clamp 501 and is structurally supported by the die clamp 501. In addition, the lead frames or flex leads 405 are used to provide electrical connections between the connection points 25 and the PCB 301. The circles 510 represent the mechanical connection points for the die clamp 501 and the semiconductor die 202. Because the direct bonding of semiconductor die connection points 205 to the PCB 301 could be difficult using a die clamp 501, the embodiment 500 depicts these connections being done using the lead frame or flex lead 405. Other variations could be implemented as desired.

Figure 6:
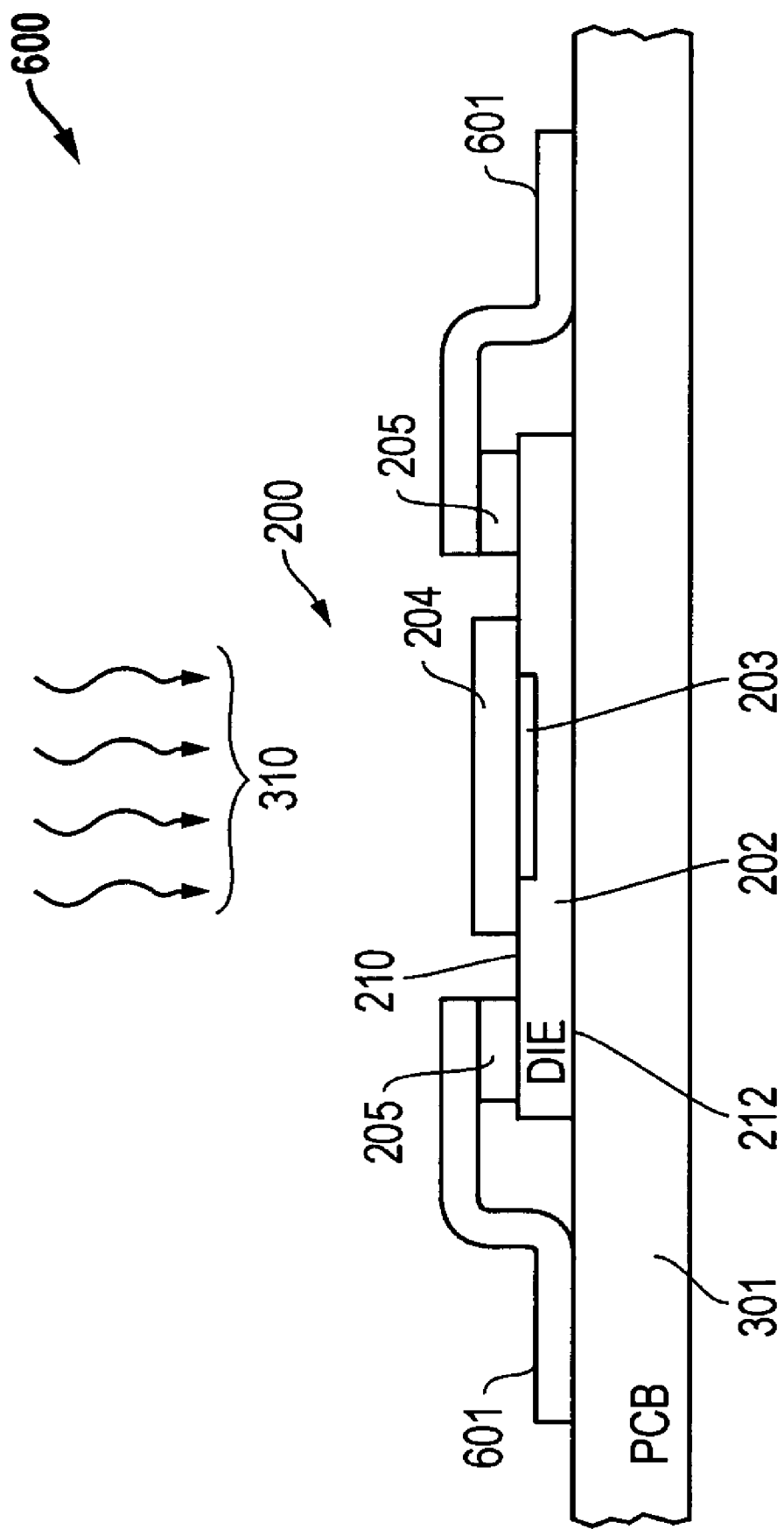
FIG. 6 is a diagram of an infrared detector system having its back coupled directly to a printed circuit board (PCB) rather than to a separate heat sink.

FIG. 6 shows an alternate embodiment 600 of an infrared detector system 200 mounted to a printed circuit board (PCB) without having a separate heat sink 201. As with FIG. 3, the infrared detector array 203 is formed on the front surface 210 of the semiconductor die 202. The lid 204 is again covering the infrared detector array 203. Unlike FIG. 3, traditional surface mount techniques are not used to provide the electrical and mechanical connections. Rather the semiconductor die 202 is directly mounted on to the PCB 301. And the connection points 205 are coupled to the PCB 301 using standard bond wires. In addition, the heat sinking capabilities of PCB 301 under die 212 could be enhanced, if desired, by adding copper traces to PCB 301. Other variations could be implemented as desired.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. An image detector assembly for infrared imaging systems, comprising:
   a printed circuit board (PCB) having a plurality of electrical connection points;
   an infrared image detector system mounted to the PCB, the infrared image detector system comprising a semiconductor die having a first and second opposing surfaces, an infrared image detector array formed on the first surface of the semiconductor die, and a plurality of electrical connection points coupled to the electrical connection points of the PCB; and
   a heat sink coupled to the opposing second surface of the semiconductor die;
   wherein the PCB comprises a first and second surfaces and a window, the infrared image detector system being mounted on the first surface of the PCB such that infrared image detector array is located within the window so that infrared energy directed towards the second surface of the PCB will reach the image detector array; and
   wherein the infrared image detector system is mounted to the PCB using the heat sink.

2. The image detector assembly of claim 1, wherein the infrared image detector system further comprises:
   a semiconductor lid coupled to the first surface of the semiconductor die and configured to cover the infrared image detector array, the semiconductor lid configured to be transparent to infrared radiation and configured to form a vacuum sealed region above the infrared image detector array;
   a plurality of connection points on the first surface of the semiconductor die electrically coupled to the plurality of connection points on the PCB.

3. The image detector assembly of claim 1, further comprising a material transparent to infrared radiation configured to cover the infrared image detector array.

4. The image detector assembly of claim 1, wherein the electrical connection points on the first surface of the semiconductor die comprise bond pads and are surface mounted to the PCB electrical connection points.

5. The image detector assembly of claim 4, further comprising a spacer coupled between the heat sink and the PCB.

6. The assembly of claim 1, further comprising two or more spacers coupled between the heat sink and the PCB to mount the infrared image detector system to the first surface of the PCB.

7. The image detector assembly of claim 6, wherein the electrical connection points on the first surface of the semiconductor die are coupled to the electrical connection points on the PCB utilizing a lead frame, flex leads, or a combination thereof.

8. The image detector assembly of claim 1, further comprising one or more spacers coupled between the heat sink and the PCB to mount the infrared image detector system to the first surface of the PCB.

9. An image detector assembly for infrared imaging systems, comprising:
   a printed circuit board (PCB) having a plurality of electrical connection points;
   an infrared image detector system mounted to the PCB, the infrared image detector system comprising a semiconductor die having a first and second opposing surfaces, an infrared image detector array formed on the first surface of the semiconductor die, and a plurality of electrical connection points coupled to the electrical connection points of the PCB; and
   a heat sink coupled to the opposing second surface of the semiconductor die;
   wherein the PCB comprises a first and second surfaces and a window, the infrared image detector system being mounted on the first surface of the PCB such that infrared image detector array is located within the window so that infrared energy directed towards the second surface of the PCB will reach the image detector array; and
   further comprising a die clamp coupled to the PCB and positioned to hold the infrared image detector system within the window, the infrared image detector system being mounted to the die clamp.

10. The assembly of claim 9, wherein the electrical connection points on the first surface of the semiconductor die are coupled to the electrical connection points on the PCB utilizing a lead frame, flex leads, or a combination thereof.

11. An infrared imaging system, comprising:
   an image detector assembly, comprising:
   a printed circuit board (PCB) having a plurality of electrical connection points; and an infrared image detector system mounted to the PCB, the infrared image detector system comprising a semiconductor die having a first and second opposing surfaces, an infrared image detector array formed on the first surface of the semiconductor die, and a plurality of electrical connection points coupled to the electrical connection points of the PCB;

an infrared lens assembly configured to receive infrared radiation and to focus it on the infrared image detector array;

image processing circuitry coupled to receive image information from the image detector assembly;

display circuitry coupled to the image processing circuitry and configured to provide image information to a display device; and a heat sink coupled to the opposing second surface of the semiconductor die;

wherein the PCB comprises a first and second surfaces and a window, the infrared image detector system being mounted on the first surface of the PCB such that infrared image detector array is located within the window so that infrared energy directed towards the second surface of the PCB will reach the image detector array; and wherein the infrared image detector system is mounted to the PCB using the heat sink.

12. The infrared imaging system of claim 11, wherein the infrared image detector system further comprises:

a semiconductor lid coupled to the first surface of the semiconductor die and configured to cover the infrared image detector array, the semiconductor lid configured to be transparent to infrared radiation and configured to form a vacuum sealed region above the infrared image detector array;

a plurality of connection points on the first surface of the semiconductor die electrically coupled to the plurality of connection points on the PCB.

13. The infrared imaging system of claim 11, wherein the electrical connection points on the first surface of the semiconductor die comprise bond pads and are surface mounted to the PCB electrical connection points.

14. The infrared imaging system claim 11, further comprising two or more spacers coupled between the heat sink and the PCB to mount the infrared image detector system to the first surface of the PCB.

15. The infrared imaging system of claim 11, further comprising one or more spacers coupled between the heat sink and the PCB to mount the infrared image detector system to the first surface of the PCB.

16. A method for assembling an infrared imaging system, comprising:

mounting an infrared image detector system to a printed circuit board (PCB), the infrared image detector system comprising a semiconductor die having a first and second opposing surfaces, an infrared image detector array formed on the first surface of the semiconductor die, and a plurality of electrical connection points;

coupling the plurality of electrical connection points on the first surface of the semiconductor die to a plurality of electrical connection points on the PCB; and coupling an infrared lens system to the PCB so that infrared energy passing through the infrared lens system on the infrared image detector array;

wherein a heat sink is coupled to the opposing second surface of the semiconductor die; and wherein the PCB comprises a first and second surfaces and a window and wherein the infrared image detector system is mounted on the first surface of the PCB such that infrared image detector array is located within the window so that infrared energy directed towards the second surface of the PCB will reach the image detector array; and mounting the infrared image detector system to the PCB using the heat sink.

17. The method of claim 16, wherein the mounting step comprises surface mounting a the electrical connection points on the first surface of the semiconductor die to the PCB electrical connection points.

18. The method of claim 16, wherein the mounting step comprises utilizing one or more spacers coupled between the heat sink and the PCB to mount the infrared image detector system to the first surface of the PCB.

19. A method for assembling an infrared imaging system, comprising:

mounting an infrared image detector system to a printed circuit board (PCB), the infrared image detector system comprising a semiconductor die having a first and second opposing surfaces, an infrared image detector array formed on the first surface of the semiconductor die, and a plurality of electrical connection points;

coupling the plurality of electrical connection points on the first surface of the semiconductor die to a plurality of electrical connection points on the PCB; and coupling an infrared lens system to the PCB so that infrared energy passing through the infrared lens system on the infrared image detector array;

wherein a heat sink is coupled to the opposing second surface of the semiconductor die; and wherein the PCB comprises a first and second surfaces and a window and wherein the infrared image detector system is mounted on the first surface of the PCB such that infrared image detector array is located within the window so that infrared energy directed towards the second surface of the PCB will reach the image detector array; and wherein the mounting step comprises utilizing a die clamp coupled to the PCB to hold the infrared image detector system within the window.

* * * * *

UNITED STATES PATENT AND TRADEMARK OFFICE
CERTIFICATE OF CORRECTION

| | | |
|---|---|---|
| PATENT NO. | : 7,514,684 B2 | Page 1 of 1 |
| APPLICATION NO. | : 11/511199 | |
| DATED | : April 7, 2009 | |
| INVENTOR(S) | : Roland W. Gooch | |

It is certified that error appears in the above-identified patent and that said Letters Patent is hereby corrected as shown below:

In claim 17, column 8, line 21, delete "a the" and insert -- the --.

Signed and Sealed this

Nineteenth Day of May, 2009

JOHN DOLL
*Acting Director of the United States Patent and Trademark Office*